(12) United States Patent
Eweda et al.

(10) Patent No.: US 8,832,170 B2
(45) Date of Patent: Sep. 9, 2014

(54) SYSTEM AND METHOD FOR LEAST MEAN FOURTH ADAPTIVE FILTERING

(75) Inventors: Eweda Eweda, Ajman (AE); Azzedine Zerguine, Dharan (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 278 days.

(21) Appl. No.: 13/430,425

(22) Filed: Mar. 26, 2012

(65) Prior Publication Data

US 2013/0254250 A1    Sep. 26, 2013

(51) Int. Cl.
*G06F 17/10*    (2006.01)

(52) U.S. Cl.
USPC .......................................... 708/322; 708/300

(58) Field of Classification Search
None
See application file for complete search history.

(56) References Cited

U.S. PATENT DOCUMENTS

| | | | | |
|---|---|---|---|---|
| 4,225,832 | A | * | 9/1980 | Faye ................................ 333/16 |
| 4,849,945 | A | | 7/1989 | Widrow |
| 5,216,629 | A | * | 6/1993 | Gurcan et al. ................. 708/322 |
| 5,793,875 | A | | 8/1998 | Lehr et al. |
| 7,133,886 | B2 | * | 11/2006 | Jin et al. ......................... 708/322 |
| 7,471,904 | B2 | | 12/2008 | Kaneda et al. |

FOREIGN PATENT DOCUMENTS

| | | |
|---|---|---|
| CN | 101894561 A | 11/2010 |
| CN | 101634669 B | 11/2011 |
| EP | 1054536 B1 | 8/2006 |
| JP | 2004064681 A | 2/2004 |
| JP | 2010226629 A | 10/2010 |

OTHER PUBLICATIONS

Chambers, J.and Avlonitis, A., "A robust mixed-norm adaptive filter algorithm", Signal Processing Letters, IEEE, vol. 4, Issue 2, pp. 46-48, Feb. 1997.

Zerguine, A., "Convergence behavior of the normalized least mean fourth algorithm", Signals, Systems and Computers, 2000. Conference Record of the Thirty-Fourth Asilomar Conference on, Oct. 29, 2000-Nov. 1, 2000, pp. 275-278.

\* cited by examiner

*Primary Examiner* — Michael D Yaary
(74) *Attorney, Agent, or Firm* — Richard C Litman

(57) ABSTRACT

The system and method for least mean fourth adaptive filtering is a system that uses a general purpose computer or a digital circuit (such as an ASIC, a field-programmable gate array, or a digital signal processor that is programmed to utilize a normalized least mean fourth algorithm. The normalization is performed by dividing a weight vector update term by the fourth power of the norm of the regressor.

4 Claims, 5 Drawing Sheets

SYSTEM AND METHOD FOR LEAST MEAN FOURTH ADAPTIVE FILTERING

BACKGROUND OF THE INVENTION

1. Field of the Invention

The present invention relates to digital signal processing techniques and signal filtering, and particularly to a system and method for least mean fourth adaptive filtering that provides an adaptive filter and method of adaptive filtering utilizing a normalized least mean fourth algorithm.

2. Description of the Related Art

The least mean fourth (LMF) algorithm has uses in a wide variety of applications. The algorithm outperforms the well-known least mean square (LMS) algorithm in cases with non-Gaussian noise. Even in Gaussian environments, the LMF algorithm can outperform the LMS algorithm when initialized far from the Wiener solution. The true usefulness of the LMF algorithm lies in its faster initial convergence and lower steady-state error relative to the LMS algorithm. More importantly, its mean-fourth error cost function yields better performance than that of the LMS for noise of sub-Gaussian nature, or noise with a light-tailed probability density function. However, this higher-order algorithm requires a much smaller step-size to ensure stable adaptation, since the cubed error in the LMF gradient vector can cause devastating initial instability, resulting in unnecessary performance degradation.

One approach to solving the above degradation problem is to normalize the weight update term of the algorithm. In conventional techniques, the LMF algorithm is normalized by dividing the weight vector update term by the squared norm of the regressor. In some prior art techniques, this normalization is performed by dividing the weight vector update term by a weighted sum of the squared norm of the regressor and the squared norm of the estimation error vector. Thus, the LMF algorithm is normalized by both the signal power and the error power. Combining the signal power and the error power has the advantage that the former normalizes the input signal, while the latter can dampen down the outlier estimation errors, thus improving stability while still retaining fast convergence.

The above has been modified by using an adaptive, rather than fixed, mixing parameter in the weighted sum of the squared norm of the regressor and the squared norm of the estimation error vector. The adaptation of the mixing parameter improves the tracking properties of the algorithm. However, unlike the normalization of the LMS algorithm, the above normalization techniques of the LMF algorithm do not protect the algorithm from divergence when the input power of the adaptive filter increases. In fact, as will be shown below, the above prior art normalized LMF (NLMF) algorithms diverge when the input power of the adaptive filter exceeds a threshold that depends on the step-size of the algorithm. The reason for this drawback is that in all of the above techniques, the weight vector update term, which is a fourth order polynomial of the regressor, is normalized by a second order polynomial of the regressor.

The prior art normalization techniques do not ensure a normalization of the input signal. Thus, the algorithm stability remains dependent on the input power of the adaptive filter.

For the particular application of adaptive plant identification, as diagrammatically illustrated in FIG. 1, the output $a_k$ of the unknown plant 100 is given by:

$$a_k = g^T x_k + b_k \qquad (1)$$

where $$g = (g_1, g_2, \ldots, g_N)^T \qquad (2)$$

is a vector composed of the plant parameters $g_i$ (from an unknown finite impulse response (FIR) filter 102), and $$x_k = (x_k, x_{k-1}, x_{k-2}, \ldots, x_{k-N+1})^T \qquad (3)$$

is the regressor vector at time k. N is the number of plant parameters, $x_k$ is the plant input, $b_k$ is the plant noise, and the notation $(.)^T$ represents the transpose of $(.)$. The identification of the plant is made by an adaptive finite impulse response (FIR) filter 104 whose length is assumed equal to that of the plant. The weight vector $h_k$ of the adaptive filter is adapted on the basis of the error $e_k$, which is given by $$e_k = a_k - h_k^T x_k, \qquad (4)$$

where $h_k = (h_{1,k}, h_{2,k}, \ldots, h_{N,k})^T$. The adaptation algorithm of interest is the LMF algorithm, which is described by $$h_{k+1} = h_k + \mu e_k^3 x_k, \qquad (5)$$

where $\mu > 0$ is the algorithm step-size. The error signal $e_k$ can be decomposed into two terms as follows:

$$e_k = b_k + \epsilon_k. \qquad (6)$$

The first term on the right hand side of equation (6), $b_k$, is the plant noise. The second term, $\epsilon_k$, is the excess estimation error. The weight deviation vector is defined by $$v_k = h_k - g. \qquad (7)$$

From equations (1), (4), (6) and (7), $$\epsilon_k = -v_k^T x_k. \qquad (8)$$

Inserting equations (1), (4) and (7) into equation (5) yields $$v_{k+1} = v_k + \mu(b_k - v_k^T x_k)^3 x_k. \qquad (9)$$

In the above, the following assumptions are used: The first assumption (assumption A1) is that the sequences $\{x_k\}$ and $\{b_k\}$ are mutually independent. The second assumption (assumption A2) is that $\{x_k\}$ is a stationary sequence of zero mean random variables with a finite variance $\sigma_x^2$. The third assumption (assumption A3) is that $\{b_k\}$ is a stationary sequence of independent zero mean random variables with a finite variance $\sigma_b^2$. Such assumptions are typical in the context of adaptive filtering.

In order to emphasize the need for normalization in the least mean fourth algorithm, examining the normalization of the LMS algorithm is important. The stability of the LMS algorithm is dependent upon the input power of the adaptive filter. This makes it very hard, if not impossible, to choose a step-size that guarantees stability of the algorithm when there is lack of knowledge about the input power. This is solved by normalizing the weight update term by $\|x_k\|^2$, where $\|x_k\|$ is the Euclidean norm of the vector $x_k$, which is defined as $\|x_k\| = \sqrt{x_k^T x_k}$. The resulting algorithm is referred to as the normalized LMS (NLMS) algorithm. This algorithm is stable for all values of the filter input power so long as the step-size is between 0 and 2.

It is desirable to develop a version of the LMF algorithm that has a similar feature as that of the NLMS algorithm; i.e., stability for all values of the filter input power for an appropriate fixed range of the step-size. One prior art normalization technique is given as $$v_{k+1} = v_k + \mu(b_k - v_k^T x_k)^3 \frac{x_k}{\|x_k\|^2}, \qquad (10)$$

and a second version is given by $$v_{k+1} = v_k + \mu(b_k - v_k^T x_k)^3 \frac{x_k}{\delta + \lambda \|x_k\|^2 + (1-\lambda)\|e_k\|^2}, \quad (11)$$

where $\delta$ is a small positive number, $0<\delta<1$, and $e_k=(e_k, e_{k-1}, e_{k-2}, \ldots, e_{k-N+1})^T$ is the error vector. The parameter $\lambda$ is referred to as the mixing power parameter. The choice of $\lambda$ is a compromise between fast convergence and low steady-state error. However, the stability of the above algorithms depends on the mean square input of the adaptive filter. To show this undesired feature for the algorithm of equation (10), we may consider the scalar case, N=1, with zero noise, $b_k$=0, and binary input, $x_k \in \{-1,1\}$, with $\mu$=0.5. In this case, equation (10) implies that:

$$v_{k+1} = v_k - 0.5 v_k^3. \quad (12)$$

If $v_1$=1, then equation (12) implies that $v_2$=0.5, $v_3$=0.4375, $v_4$=0.3956, $v_5$=0.3647, etc. Thus, $v_k$ is decaying in this case. Repeating this example with $x_k \in \{-4,4\}$, while keeping all other conditions unchanged, equation (10) implies that:

$$v_{k+1} = v_k - 8 v_k^3. \quad (13)$$

Again, if $v_1$=1, then equation (13) yields $v_2$=−7, $v_3$=2737, $v_4$=1.6(10$^{11}$), $v_5$=3.5(10$^{34}$), etc. Thus, the algorithm of equation (10) diverges in this case. This shows that the stability of the normalized LMF algorithm of equation (10) depends on the input power of the adaptive filter.

It can also be shown that the stability of the algorithm of equation (11) also depends on the input power. We may consider again the scalar case with $\mu$=0.5, $\delta$=0, $\lambda$=0.5, $x_k \in \{-1,1\}$, and $b_k$=0. In this case, equations (6) and (8) imply that $e_k^2 = v_k^2 x_k^2$ and equation (11) implies that:

$$v_{k+1} = v_k - \frac{v_k^3}{1+v_k^2}. \quad (14)$$

If $v_1$=1, then equation (14) produces $v_2$=0.5, $v_3$=0.4, $v_4$=0.3448, $v_5$=0.3082, etc. Thus, $v_k$ is decaying in this case. Repeating this example with $x_k \in \{-4,4\}$, while keeping all other conditions unchanged, equation (11) implies that:

$$v_{k+1} = v_k - \frac{16 v_k^3}{1+v_k^2}. \quad (15)$$

Again, if $v_1$=1, then equation (15) produces $v_2$=−7, $v_3$=102.76, $v_4$=1541.2, $v_5$=23119, etc. Thus, the algorithm of equation (11) diverges in this case. This shows that the stability of the normalized LMF algorithm of equation (11) depends on the input power of the adaptive filter.

The above results regarding the dependence of the stability of the prior art NLMF algorithms on the input power of the adaptive filter suggest the need for an NLMF algorithm whose stability does not depend on the input power. Thus, a system and method for least mean fourth adaptive filtering solving the aforementioned problems is desired.

SUMMARY OF THE INVENTION

The system and method for least mean fourth adaptive filtering is a system that uses a general purpose computer or a digital circuit (such as an ASIC, a field-programmable gate array, or a digital signal processor that is programmed to utilize a normalized least mean fourth algorithm. The normalization is performed by dividing a weight vector update term by the fourth power of the norm of the regressor. The normalized least mean fourth algorithm remains stable as the filter input power increases.

The least mean fourth adaptive filter includes a finite impulse response filter having a desired output $a_k$ at a time k. An impulse response of the finite impulse response filter is defined by a set of weighting filter coefficients $h_k$, and an input signal of the finite impulse response filter is defined by a regressor input signal vector, $x_k$, at the time k. An error signal $e_k$ at the time k is calculated as a difference between the desired output $a_k$ at the time k and an estimated signal given by $h_k^T x_k$, such that $e_k = a_k - h_k^T x_k$. The set of weighting filter coefficients are iteratively updated as $$h_{k+1} = h_k + \alpha \frac{e_k^3 x_k}{\|x_k\|^4},$$

where $\alpha$ is a fixed positive number step-size.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
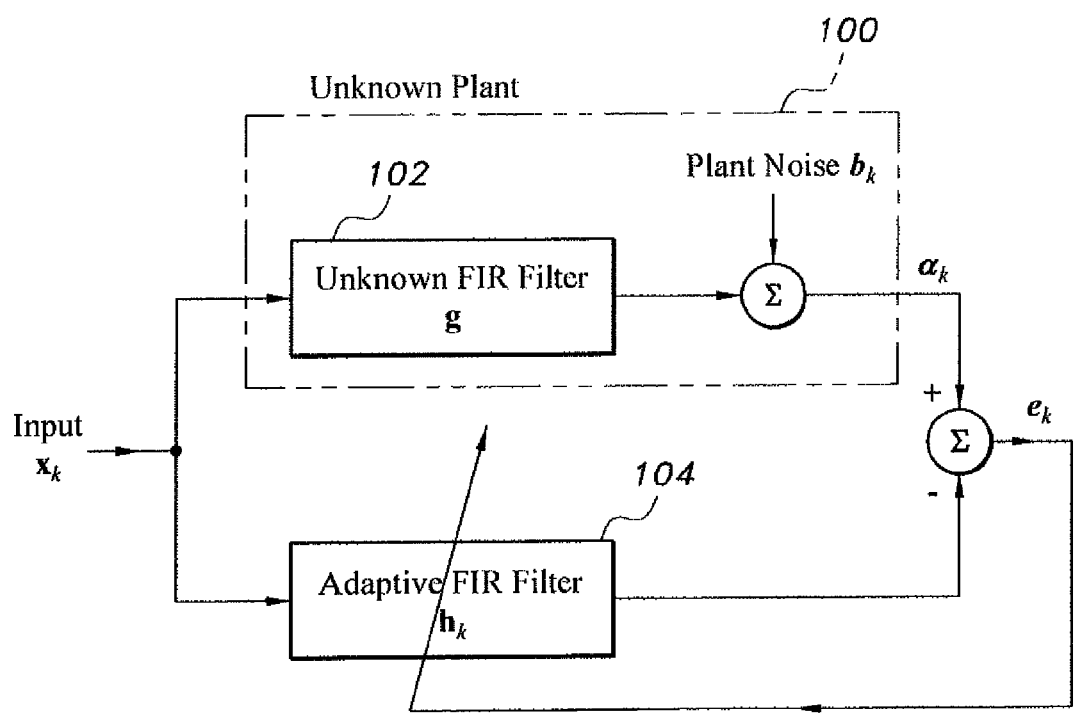
FIG. 1 is a diagram of a plant to be identified digital signal processing techniques.

The system and method for least mean fourth adaptive filtering is a system that uses a general purpose computer or a digital circuit (such as an ASIC, a field-programmable gate array, or a digital signal processor that is programmed to utilize a normalized least mean fourth algorithm. The normalization is performed by dividing a weight vector update term by the fourth power of the norm of the regressor. The normalized least mean fourth algorithm remains stable as the filter input power increases.

In order to examine the present least mean fourth adaptive filter, it is useful to first consider the scalar case, in which N=1 (where N is the number of plant parameters) with zero noise. In such a case, equation (9) simplifies to:

$$v_{k+1} = (1 - \mu x_k^4 v_k^2) v_k. \quad (16)$$

The stability of the algorithm represented by equation (16) depends on the statistics of $x_k$ (i.e., the plant input). This dependence is removed by using a variable step-size $\mu$ that satisfies the following:

$$\mu = \frac{\alpha}{x_k^4}, \quad (17)$$

assuming that $x_k \neq 0$ for all k and that $\alpha$ is a fixed positive number. In such a case, equation (16) becomes $$v_{k+1} = (1 - \alpha v_k^2) v_k. \quad (18)$$

Since $\alpha$ does not depend on $x_k$, the sequence $\{v_k\}$ generated by equation (18) also does not depend on $x_k$. Thus, the stability of equation (18) does not depend on the statistics of $x_k$. A sufficient condition for the decay of $|v_k|$ for all k is that:

$$0 < \alpha < \frac{2}{v_k^2}, \text{ for all } k. \quad (19)$$

When $|v_k|$ is decreasing, $|v_1|$ will be the largest value of $|v_k|$. Then, a sufficient condition for equation (19) is:

$$0 < \alpha < \frac{2}{v_1^2}. \quad (20)$$

Equation (20) is the step-size range that is sufficient for the convergence of the algorithm represented by equation (16).

The above can now be extended to the N-dimensional LMF algorithm described by equation (9). A factor that determines the convergence of the algorithm is its behavior at the start of adaptation. At the start of adaptation, the magnitude of the deviation vector $v_k$ is usually so large that the excess estimation error $v_k^T x_k$ dominates the plant noise $b_k$. In such a case, equation (9) can be approximated as:

$$v_{k+1} \approx v_k - \mu (v_k^T x_k)^3 x_k = T_k v_k, \quad (21)$$

where the transformation matrix $T_k$ is given by:

$$T_k = I - \mu x_k x_k^T v_k v_k^T x_k x_k^T. \quad (22)$$

The transformation matrix of equation (22) depends on $\|x_k\|$. This dependence can be removed by using a variable step-size $\mu$ that satisfies:

$$\mu = \frac{\alpha}{\|x_k\|^4}, \quad (23)$$

assuming that $x_k \neq 0$ for all k and that $\alpha$ is a fixed positive number. In such a case, equation (22) becomes:

$$T_k = I - \alpha \frac{x_k x_k^T v_k v_k^T x_k x_k^T}{\|x_k\|^4}. \quad (24)$$

The matrix $T_k$ given by equation (24) depends on the direction of the vector $x_k$, but it does not depend on its norm, $\|x_k\|$. Inserting equation (23) into equation (5) yields:

$$h_{k+1} = h_k + \alpha \frac{e_k^3 x_k}{\|x_k\|^4}. \quad (25)$$

Equation (25) represents the present NLMF algorithm. Due to equation (4), the weight vector update term on the right-hand side of equation (25) is proportional to the negative gradient of $(e_k/\|x_k\|)^4$ with respect to $h_k$. Thus, the algorithm represented by equation (25) may be viewed as a gradient algorithm based on the minimization of the mean fourth normalized estimation error $E(e_k/\|x_k\|)^4$. Similar to the NLMS algorithm, the NLMF algorithm represented by equation (25) may be regularized by adding a small positive number to $\|x_k\|^4$ in order to avoid division by zero.

In the following, a condition on the step-size a is derived that is sufficient for the convergence of the algorithm of equation (25). First, a step-size range is derived that is sufficient for stability of the algorithm in the initial phase of adaptation. Then, a step-size range that is sufficient for steady-state stability is derived. The final step-size range is obtained from the intersection of these two ranges.

One is typically interested in mean-square stability that is based on the evolution of the mean-square deviation $E(\|v_k\|^2)$ with time, where E denotes the mathematical expectation operator. In the initial phase, the magnitude of $E(v_k)$ is usually large in comparison with the fluctuation of $v_k$ around $E(v_k)$. Thus, $E(\|v_k\|^2) \approx \|E(v_k)\|^2$ in the initial phase of adaptation. Consequently, the derivation of the stability step-size range in the initial adaptation phase can be simplified by calculating it on the base of the mean of $v_k$, rather than the mean square of $v_k$. This is not the case with the steady-state condition that should be derived on the base of the mean-square of $v_k$.

With respect to the initial phase condition, at the start of adaptation, the magnitude of the deviation vector $v_k$ is usually so large that the excess estimation error $v_k^T x_k$ dominates the plant noise $b_k$. In such a case, equation (25) can be approximated by equation (21), with $T_k$ being given by equation (24). Letting $E(x|y)$ denote the conditional expectation of x given y, then a condition on a is derived that implies that:

$$\|E(v_{k+1}|v_k)\| \leq \|v_k\|. \quad (26)$$

This condition means that the magnitude of the weight deviation vector is decreasing each iteration step, in a mean sense. Due to equation (21), $E(v_{k+1}|v_k) = E(T_k|v_k)v_k$. Then, a sufficient condition for equation (26) is that the magnitude of all the eigenvalues of the matrix $E(T_k|v_k)$ are less than 1. Due to equation (24), the eigenvalues of $E(T_k|v_k)$ are equal to $1 - \alpha \lambda_i(k)$, where $\lambda_i(k)$; i=1, 2, . . . , N are the eigenvalues of the matrix P(k), defined by:

$$P(k) \equiv E\left(\frac{x_k x_k^T v_k v_k^T x_k x_k^T}{\|x_k\|^4} \middle| v_k\right). \quad (27)$$

Thus, a sufficient condition for equation (26) is that:

$$|1 - \alpha \lambda_i(k)| < 1, i=1,2,\ldots,N \quad (28)$$

It is assumed that the matrix P(k) is positive definite. This assumption is a sort of persistent excitation assumption. A geometrical validation of this assumption is given below. From equation (27), the trace of the matrix P(k) is less than or equal to $\|v_k\|^2$. Thus, $$0 < \lambda_i(k) \leq \|v_k\|^2, i=1,2,\ldots,N. \quad (29)$$

Equation (29) implies that a sufficient condition for equation (28) is that $$0 < \alpha < \frac{2}{\|v_k\|^2}. \quad (30)$$

Physically speaking, in order to satisfy equation (30) for all k, it is sufficient to satisfy it at k=1, since the maximum weight deviation takes place at the start of adaptation. This leads to the following condition:

$$0 < \alpha < \frac{2}{\|v_1\|^2}. \quad (31)$$

Equation (31) is the step-size range that is sufficient for stability of the NLMF algorithm of equation (25) in the initial phase of adaptation. This step-size range does not depend on the input power of the adaptive filter. The range given by equation (31) reflects the dependence of the stability of the LMF algorithm on the weight initialization of the adaptive filter.

The following provides a geometrical validation of the above assumption that the matrix P(k) is positive definite. For any vector u in the N-dimensional space, equation (27) implies that:

$$u^T P(k) u = E[u_x^2(k) v_x^2(k) \mid v_k], \quad (32)$$

where $$u_x(k) \equiv \frac{u^T x_k}{\|x_k\|} \quad (33)$$

is the projection of the vector u on the vector $x_k$, and $$v_x(k) \equiv \frac{v_k^T x_k}{\|x_k\|} \quad (34)$$

is the projection of the vector $v_k$ on the vector $x_k$. When $x_k$ is persistently exciting, it spans the whole N-dimensional space. Then, with non-zero probability, the projections of given vectors u and $v_k$ on $x_k$ will be different from zero, which implies that $u_x^2(k) v_x^2(k)$ will be positive. This implies that the right-hand side of equation (32) will be positive, which implies that the matrix P(k) is positive definite.

With regard to the steady-state condition, a sufficient condition of the steady-state stability of the mean square deviation of the regular LMF algorithm of equation (5) is given by:

$$0 < \mu < \frac{E(b_k^2)}{10 E(b_k^4) E(\|x_k\|^2)}. \quad (35)$$

For long adaptive filters, $\|x_k\|^4$ can be approximated by $E(\|x_k\|^4)$. Then, equation (23) implies that the condition of equation (35) on μ can be mapped to the following condition on α:

$$0 < \alpha < \frac{E(b_k^2) E(\|x_k\|^4)}{10 E(b_k^4) E(\|x_k\|^2)}. \quad (36)$$

Equation (36) is the step-size range that is sufficient for stability of the present NLMF algorithm of equation (25) in the steady-state.

With regard to the final step-size condition, equation (31) is sufficient for convergence of the NLMF algorithm of equation (25) in the initial phase of adaptation, while equation (36) is sufficient for stability around the Wiener solution. Both properties can be achieved by using the step-size to satisfy the following condition:

$$0 < \alpha < \alpha_o, \quad (37)$$

where $$\alpha_o = \min\left\{\frac{2}{\|v_1\|^2}, \frac{E(b_k^2) E(\|x_k\|^4)}{10 E(b_k^4) E(\|x_k\|^2)}\right\}. \quad (38)$$

For a long adaptive filter, $E(\|x_k\|^4)/E(\|x_k\|^2) \approx N \sigma_x^2$. Then, the second term in the argument of the min {.} function on the right-hand side of equation (38) is increasing in N and the signal-to-noise ratio $\sigma_x^2/\sigma_b^2$. Thus, for the long adaptive filter, non-small signal-to-noise ratio, and non-small initial weight deviation $\|v_1\|$, $$\frac{2}{\|v_1\|^2} \leq \frac{E(b_k^2) E(\|x_k\|^4)}{10 E(b_k^4) E(\|x_k\|^2)}. \quad (39)$$

For illustration of equation (39), an example with N=32, binary input $x_k \in \{-\sigma_x, \sigma_x\}$, binary noise $b_k \in \{-\sigma_b, \sigma_b\}$, and where $\|v_1\|=1$ is considered. In this example, equation (39) holds as long as the signal-to-noise ratio $\sigma_x^2/\sigma_b^2$ is greater than 5/8. Equations (38) and (39) imply that:

$$\alpha_o = \frac{2}{\|v_1\|^2}. \quad (40)$$

Thus, the final step-size condition of equation (37) is identical with the initial phase condition of equation (31). Thus, the condition of equation (31) is sufficient for the stability of the NLMF algorithm of equation (25) in applications with a long adaptive filter and non-small signal-to-noise ratio. This condition is validated by the simulation results given below.

The following simulations were performed for the case of adaptive plant identification, as illustrated in FIG. 1. The plant 100 is made of a time-invariant FIR filter 102 with N=32 parameters. The regressor vector is given by:

$$x_k (x_k, x_{k-1}, \ldots, x_{k-N+1})^T, \quad (41)$$

where $x_k$ is the plant input. $x_k$ is a zero mean, independent and identically distributed (IID) Gaussian sequence with variance $\sigma_x^2$. The plant noise is a zero mean IID Gaussian sequence with variance $\sigma_b^2$. The plant parameters are given by:

$$g_i = \begin{cases} \rho i, & 1 \leq i \leq N/2 \\ \rho(N+1-i), & N/2 < i \leq N. \end{cases} \quad (42)$$

The value of ρ is chosen such that $\|g\|=1$. In the exemplary case of the simulation, N=32 and ρ=0.0183. The initial weight vector of the adaptive filter is $h_1=0$, thus $\|v_1\|=1$.

To study the dependence of the stability of the conventional NLMF algorithms of equations (10) and (11) and the present NLMF algorithm of equation (25) on the input power of the filter, the algorithms are simulated over a wide range of $\sigma_x$, ranging from 0.2 to 1000. The considered value of $\sigma_b$ is 0.01.

For the algorithm represented by equation (10), μ=1. For the algorithm represented by equation (11), μ=1, δ=0, and λ=0.5. For the algorithm represented by equation (25), α=1. The simulations have shown that the conventional NLMF algorithms of equations (10) and (11) diverge for $\sigma_x$=1 and above, whereas the present NLMF algorithm of equation (25) is non-divergent for all $\sigma_x$.

Figure 2:
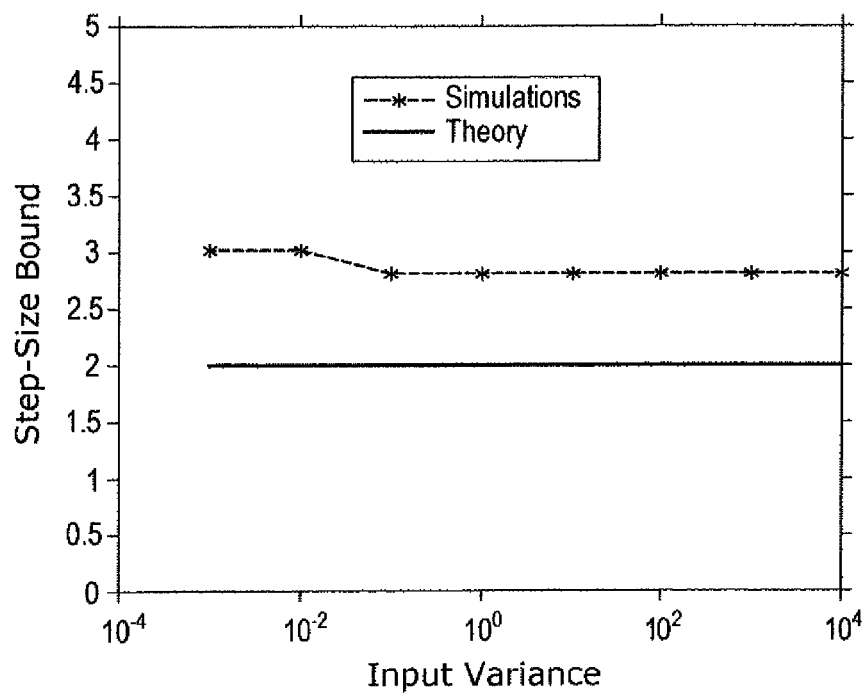
FIG. 2 is a graph illustrating simulation results of a system and method for least mean fourth adaptive filtering according to the present invention, validating step-size stability bounds for Gaussian input and noise.

In order to validate the step-size condition given by equation (31) of the present NLMF algorithm, the maximum step-size for which the algorithm is convergent is determined by simulations and compared with the step-size bound provided by equation (31). This is performed at several values of $\sigma_x$. The considered noise variance, plant parameter vector, and initial weight vector of the adaptive filter are as given above. The results are shown in FIG. 2. The stability step-size bound obtained by simulation is greater than that provided by the condition of equation (31). This is a validation of equation (31). It should be noted that the stability condition of equation (31) is sufficient, but not necessary. This means that the algorithm is not only convergent for all values of α satisfying equation (31), but it may also converge for some values of α that do not satisfy equation (31). Therefore, all that is needed from the simulations is to show that the range defined by equation (31) is included in the range obtained by simulations, which is the case with the results of FIG. 2. It is not required to show that the step-size range defined by equation (31) coincides with the range obtained by simulations.

Figure 3:
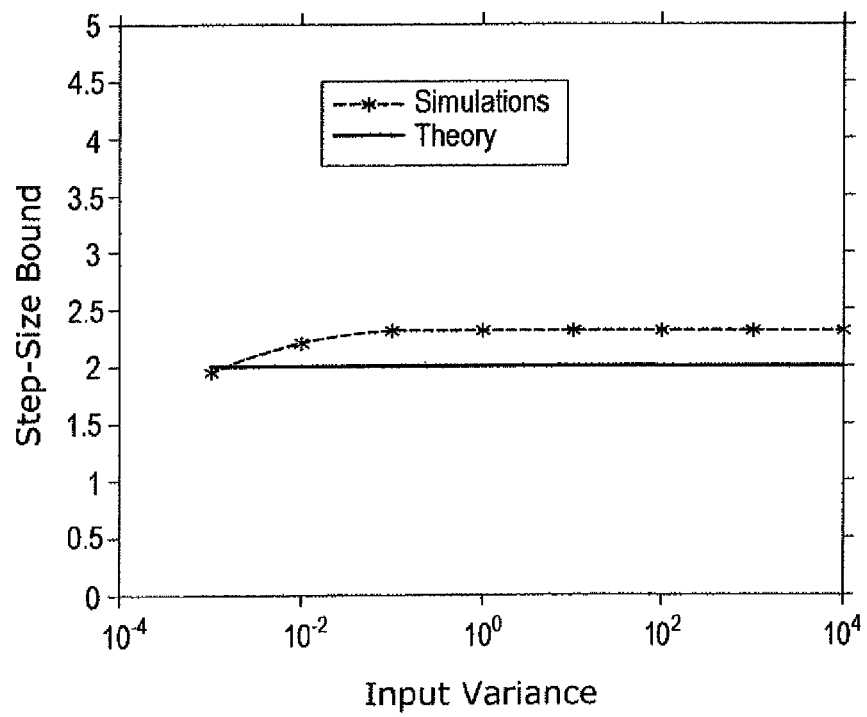
FIG. 3 is a graph illustrating simulation results of the system and method for least mean fourth adaptive filtering according to the present invention, validating step-size stability bounds for uniformly distributed input and noise.

To validate the step-size condition of equation (31) for non-Gaussian plant input and plant noise, the simulations of FIG. 2 are re-performed for uniformly distributed input and noise. The considered noise variance, plant parameter vector, and initial weight vector of the adaptive filter are the same as those considered in FIG. 2. The results are shown in FIG. 3. These results validate the sufficiency of the step-size condition given by equation (31) for the stability of the algorithm over a wide range of the input power of the adaptive filter.

Figure 4:
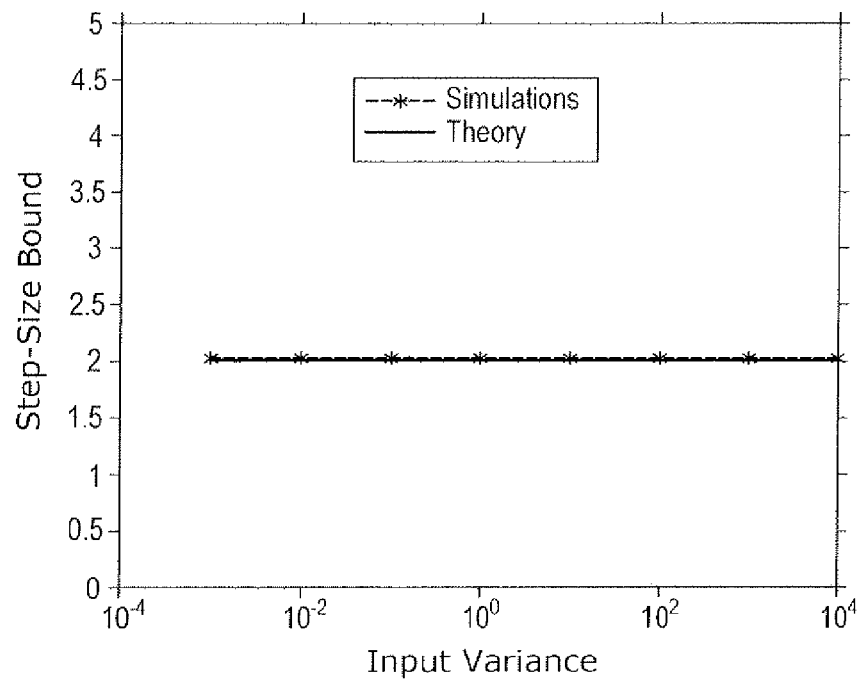
FIG. 4 is a graph illustrating simulation results of the system and method for least mean fourth adaptive filtering according to the present invention, validating step-size stability bounds for correlated input.

To validate the step-size condition given by equation (31) for non-white input of the plant, the simulations of FIG. 2 are re-performed for an autoregressive $x_k$ satisfying $$x_k = \beta x_{k-1} + \sigma_x \sqrt{1-\beta^2} w_k, 0 \leq \beta < 1, \quad (43)$$

where $w_k$ is a zero mean, unity variance IID Gaussian sequence. The parameter β controls the degree of correlation of the sequence $\{x_k\}$; the greater β is, the stronger the correlation. In the simulations, the considered value of β was 0.95, which corresponds to a strong correlation of the sequence $\{x_k\}$. This implies both a strong correlation among the components of the regressor and a strong correlation between successive regressors. The noise is white Gaussian. The considered noise variance, plant parameter vector, and initial weight vector of the adaptive filter are the same as those considered in FIG. 2. The results are shown in FIG. 4. These results validate the sufficiency of the step-size condition given by equation (31) for the stability of the algorithm over a wide range of the input power of the adaptive filter.

Figure 5:
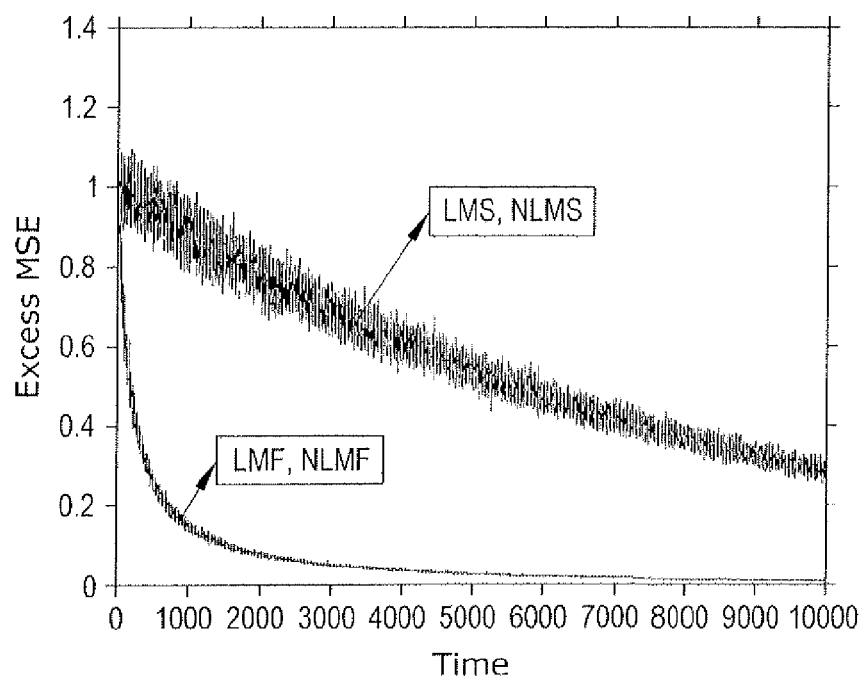
FIG. 5 is a graph comparing initial convergence of the present method for normalized least mean fourth (NLMF) adaptive filtering against that of conventional least mean fourth (LMF) adaptive filtering, least mean square (LMS) adaptive filtering and normalized least mean square (NLMS) adaptive filtering.

Finally, FIG. 5 compares the initial convergence of the present NLMF algorithm with those of the LMF, NLMS, and LMS algorithms for white Gaussian $x_k$ and $b_k$ with $\sigma_x$=1, and $\sigma_b$=0.1. FIG. 5 shows the evolution of the excess mean square error (MSE) of the algorithms with time. The instantaneous excess MSE is defined as $E(\epsilon_k^2)$, where $\epsilon_k$ is defined by equation (8). The step-sizes of the algorithms are chosen such that they have the same steady-state excess MSE. The step-size of the present NLMF algorithm is 1. The resulting steady-state excess MSE is 1×10⁻⁵. The step-sizes of the LMF, NLMS, and LMS algorithms having the same steady-state excess MSE are 0.001, 0.002, and 6.25×10⁻⁵, respectively. The instantaneous excess MSE is evaluated by averaging $\epsilon_k^2$ over 1,000 independent runs.

FIG. 5 shows that the initial convergence of the present NLMF algorithm is almost the same as that of the LMF algorithm for the same steady-state excess MSE. This means that the present NLMF algorithm retains the fast initial convergence advantage of the LMF algorithm. With regard to the similarity of the transient performances of the LMF and NLMF algorithms, for large N, $\|x_k\|^2 \leq N\sigma_x^2$. This implies that the behavior of the NLMF algorithm of equation (25) will be close to that of the LMF algorithm of equation (5) with $\mu = \alpha/(N^2 \sigma_x^4)$. This condition is satisfied by the values of μ and α considered in FIG. 5. FIG. 5 also shows that the initial convergence of the NLMS algorithm is almost the same as that of the LMS algorithm and that they are significantly slower than the LMF and NLMF algorithms.

Figure 6:
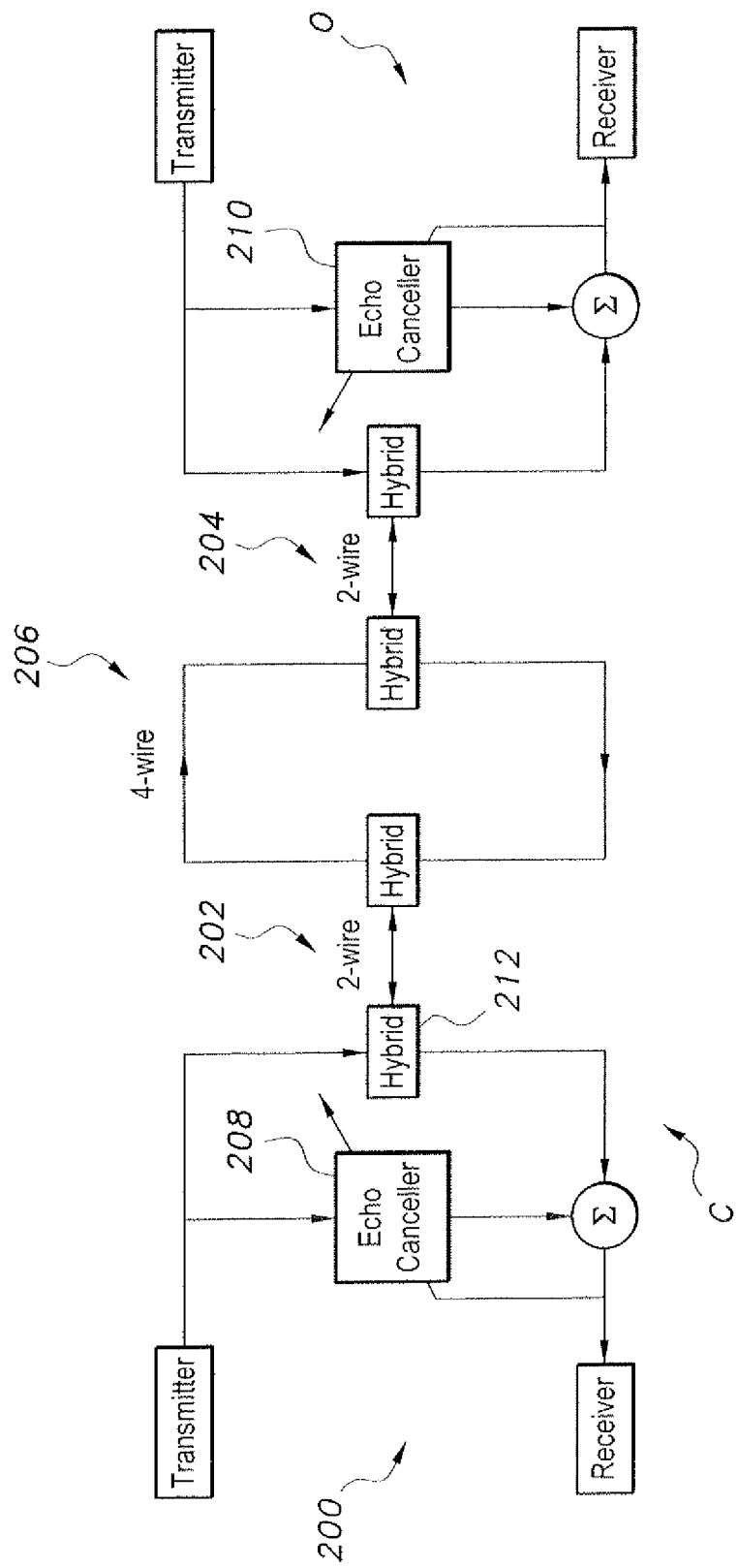
FIG. 6 is a block diagram illustrating a telecommunication system that includes echo cancellation and employs a present system and method for least mean fourth adaptive filtering according to the present invention.
Figure 7:
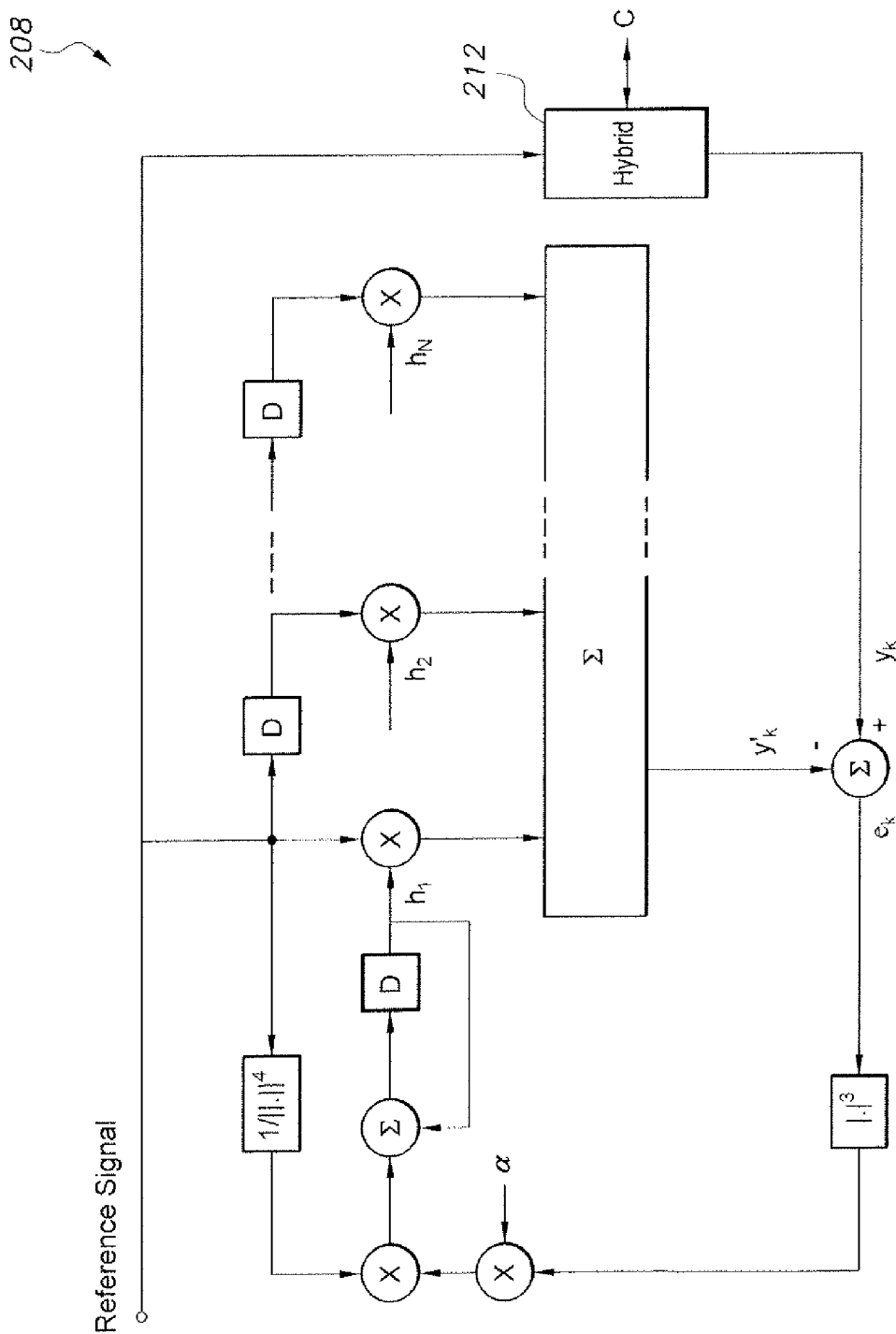
FIG. 7 is a block diagram illustrating an echo canceller used in the system of FIG. 6.

FIGS. 6 and 7 illustrate a particular application of the present system and method for least mean fourth adaptive filtering. Echoes are generated whenever part of a speech is reflected back to the source by the floor, walls, or other neighboring objects. An echo is noticeable (or audible) only if the time delay between it and the speech exceeds a few tens of milliseconds. As the result of impedance mismatches in telephone circuits, echoes are also generated. The echoes arise in various situations in telecommunications networks and impair communication quality. Long-delay echoes are often irritating to the user, whereas shorter ones, called "sidetones", are actually desirable and are intentionally inserted in telecommunications networks to make the telephone circuit seem "alive".

Echoes with long delay are observed only on long-distance connections. To clearly understand the echo phenomenon, FIG. 6 illustrates a typical long distance telephone connection 200. Central to such a connection, a pair of two-wire segments 202, 204 are provided, the ends of which connect a customer C to a central office O, along with a four-wire carrier section 206 (which might include satellite links). The two-wire circuits 202, 204 are bidirectional, whereas the four-wire circuits 206 are made of two distinct channels, one for each direction.

In order to counteract the echo phenomenon, schemes must be developed to either completely eliminate it (i.e., the ideal requirement), or to at least substantially reduce its adverse effect so as to achieve a transmission of good quality. Echo cancellation is a suitable area for the application of adaptive filtering. An adaptive echo canceller 208, 210 estimates the responses of an underlying echo-generating system in real time in the face of unknown and time-varying echo path characteristics, generates a synthesized echo based on the estimate, and cancels the echo by subtracting the synthesized echo from the received signal.

In FIG. 6, echo cancellers 208, 210 are identical, and FIG. 7 illustrates a block diagram of the echo canceller 208. The synthetic echo $y_k'$ is generated by passing the reference signal through an adaptive filter that ideally matches the impulse response of the echo path. Thus, the transversal filter generates an estimate $y_k'$ of the echo, given by:

$$y_k' = \sum_{i=0}^{N-1} h_{i,k} x_{k-i}, \quad (44)$$

where $\{h_{i,k}\}$ is the estimated echo-path impulse response sample, $x_i$ is the input sample to the $i^{th}$-tap delay, and N is the number of tap coefficients. While passing through the hybrid 212, the speech from customer C results in the echo signal $y_k$. This echo, together with the speech from office O, $r_k$, constitutes the desired response for the adaptive filter. The canceller error signal is obtained as follows:

$$\zeta_k = y_k - y_k' + r_k = e_k + r_k. \quad (45)$$

The error signal $e_k$ of FIG. 7 is used to control the adjustments to the adaptive filter coefficients according to the present normalized least mean fourth adaptive algorithm in order to continuously improve the echo estimate $y_k'$.

Ideally, the system eventually converges to the condition $\zeta_k = r_k$. The effect of this ideal condition on the echo cancellation is naturally of some concern. Convergence of the echo to zero, however, is not an adequate criterion of performance for a system of this type, since this is possible only if $y_k$ is exactly representable as the output of a fixed-tap filter. A better performance criterion is the convergence of the filter's impulse response to the response of the echo path.

It is to be understood that the present invention is not limited to the embodiments described above, but encompasses any and all embodiments within the scope of the following claims.

We claim:

1. A least mean fourth adaptive filter circuit, comprising a finite impulse response filter circuit having a desired output $a_k$ at a time k, an impulse response defined by a set of weighting filter coefficients $h_k$, and an input signal defined by a regressor input signal vector at the time k, $x_k$, the finite impulse filter circuit further having:
   - means for calculating an error signal $e_k$ at the time k as a difference between the desired output $a_k$ at the time k and an estimated signal given by $h_k^T x_k$, such that $e_k = a_k - h_k^T x_k$; and
   - means for iteratively updating the set of weighting filter coefficients as $$h_{k+1} = h_k + \alpha \frac{e_k^3 x_k}{\|x_k\|^4},$$

where $\alpha$ is a fixed positive number step-size.

2. The least mean fourth adaptive filter circuit as recited in claim 1, wherein the desired output $a_k$ at the time k is defined as $a_k = g^T x_k + b_k$, wherein g is a vector composed of plant parameters and $b_k$ represents plant noise.

3. The least mean fourth adaptive filter circuit as recited in claim 2, wherein the fixed positive number step-size $\alpha$ is selected such that $$0 < \alpha < \frac{2}{v_k^2}.$$

wherein $v_k$ is a weight deviation vector at the time k, given by $v_k \equiv h_k - g$.

4. A signal processor, comprising a processor and software means for processing a signal, the software means being executable by the processor, the software means including:
   - means for processing the signal through a finite impulse response filter having a desired output $a_k$ at a time k, an impulse response defined by a set of weighting filter coefficients $h_k$, and an input signal defined by a regressor input signal vector at the time k, $x_k$;
   - means for calculating an error signal $e_k$ at the time k as a difference between the desired output $a_k$ at the time k and an estimated signal given by $h_k^T x_k$, such that $e_k = a_k - h_k^T x_k$; and
   - means for iteratively updating the set of weighting filter coefficients as $$h_{k+1} = h_k + \alpha \frac{e_k^3 x_k}{\|x_k\|^4},$$

where $\alpha$ is a fixed positive number step-size.

* * * * *